US006767776B2

(12) United States Patent
Kawai

(10) Patent No.: US 6,767,776 B2
(45) Date of Patent: Jul. 27, 2004

(54) SEMICONDUCTOR DEVICE, AND METHOD FOR MANUFACTURING THE SAME

(75) Inventor: Yasuharu Kawai, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/209,325

(22) Filed: Jul. 31, 2002

(65) Prior Publication Data

US 2003/0034528 A1 Feb. 20, 2003

(30) Foreign Application Priority Data

Aug. 1, 2001 (JP) ........................................ 2001-233538

(51) Int. Cl.[7] ............................................ H01L 21/84
(52) U.S. Cl. ...................................... 438/159; 438/163
(58) Field of Search ................................ 438/151, 158, 438/159, 163

(56) References Cited

U.S. PATENT DOCUMENTS

| | | | | |
|---|---|---|---|---|
| 5,158,898 A | * | 10/1992 | Hayden et al. | 438/158 |
| 6,033,941 A | * | 3/2000 | Yang | 438/163 |
| 6,285,060 B1 | * | 9/2001 | Korec et al. | 257/342 |

* cited by examiner

Primary Examiner—Chandra Chaudhari
(74) Attorney, Agent, or Firm—Harness, Dickey & Pierce, P.L.C.

(57) ABSTRACT

A semiconductor device in accordance with the present invention is equipped with a gate electrode 10 formed on a BOX layer 2, a gate oxide film 11 formed on the gate electrode, a body region 12a composed of epitaxial Si formed on the gate oxide film, diffusion layers 18 and 19 for source/drain regions formed on both sides of the body region, and a body terminal connected to the body region for applying a specified potential to the body region. As a result, the substrate floating effect is suppressed even in a transistor having a short gate length and a long gate width.

5 Claims, 6 Drawing Sheets

Fig. 11 (a) (Prior Art)
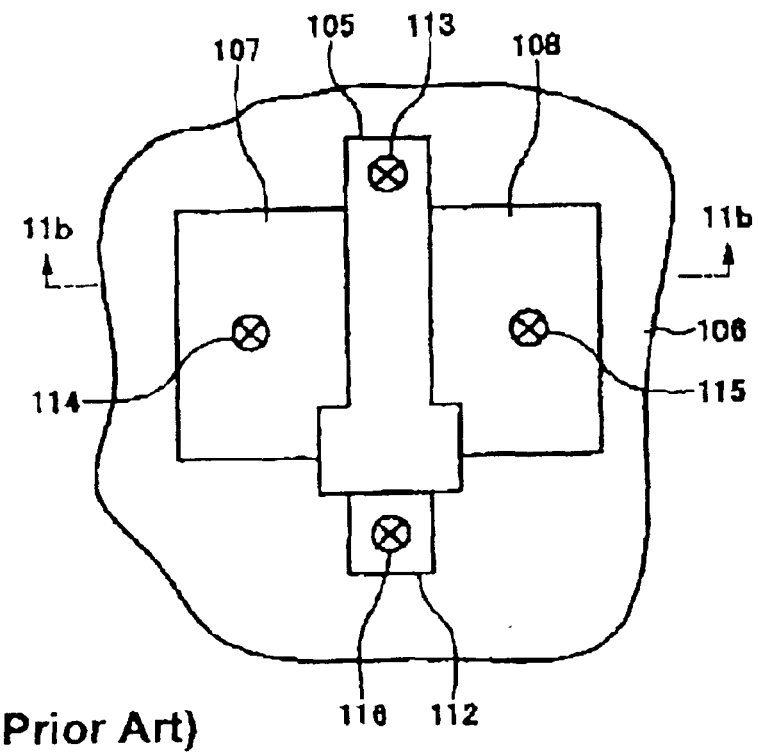
Fig. 11 (b) (Prior Art)
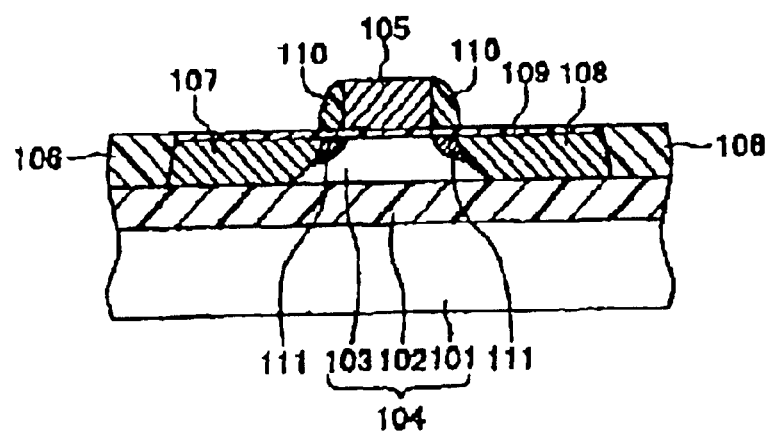

SEMICONDUCTOR DEVICE, AND METHOD FOR MANUFACTURING THE SAME

BACKGROUND OF THE INVENTION

1. Technical Field

The present invention relates to semiconductor devices and methods for manufacturing the same, and more particularly to a semiconductor device that can restrict the substrate floating effect even in a transistor having a short gate length and long gate width.

2. Discussion

FIG. 11(a) shows a plan view of one example of a conventional semiconductor device, and FIG. 11(b) shows a cross-sectional view taken along lines 11b—11b indicated in FIG. 11(a). The semiconductor device includes a transistor with a SOI (Silicon On Insulator) structure.

As shown in FIG. 11(b), the SOI substrate 104 is formed from a supporting substrate 101 composed of single crystal silicon (Si), an embedded oxide film (BOX layer) 102 formed on the supporting substrate 101, and a single crystal Si layer 103 that is formed on the embedded oxide film 102. The SOI substrate 104 can be manufactured by a variety of manufacturing methods, for example, it can be manufactured by a bonding method, a SIMOX (Separation by Implanted Oxygen) method.

An element isolation oxide film 6 is formed in the single crystal Si layer 103. A gate oxide film 109 is formed on the surface of the single crystal Si layer 103, and a gate electrode 105 is formed on the gate oxide film 109. Sidewalls 110 are formed on side walls of the gate electrode 105, and impurity diffusion layers 111 with a low impurity concentration are formed in the single crystal Si layer 103 below the sidewalls. Diffusion layers 107 and 108 for source/drain regions are formed in the single crystal Si layer 103 adjacent to the low impurity concentration diffusion layers 111.

The single crystal Si layer 103 under the gate electrode 105 defines a body region 112. The body region 112 extends outwardly from one end of the gate electrode 105 as shown in FIG. 11(a). The gate electrode 105 and the diffusion layers 107 and 108 for the source/drain regions are connected to external elements through contact sections 113 115, respectively. Also, the body region 112 is connected to a body terminal (not shown) through a contact section 116.

By the application of a specified voltage to the body region through the body terminal, the body potential is fixed and thus the substrate floating effect is controlled. The body potential is fixed because the state of the body potential is always unstable in operating the transistor unless the body potential is fixed, which substantially affects the transistor characteristics.

The conventional semiconductor device explained above is formed with a short gate length and a long gate width as shown in FIG. 11(a). In the semiconductor device having such a configuration, the body potential in an area that is far from the contact section 116 for fixing the body potential cannot be completely removed, and the substrate floating effect may occur. In other word, in a semiconductor device having a short gate length and a long gate width, the resistance in the body region is high. As a result, the body potential cannot be sufficiently fixed, and the substrate floating effect may occur.

Also, in the conventional semiconductor device described above, the body region extends out from one end of the gate electrode in order to form a contact section therein for fixing the body potential. However, as the body region is extended in this manner, the area occupied by the element increases, which is problematical because it hinders miniaturization of elements.

The present invention has been made in view of the circumstances described above, and its object is to provide a semiconductor device that can restrict the substrate floating effect even in a transistor having a short gate length and long gate width, and a method for manufacturing the same.

SUMMARY OF THE INVENTION

To solve the problems described above, a semiconductor device in accordance with the present invention is characterized in comprising:

a gate electrode formed on a dielectric film;

a gate dielectric film formed on the gate electrode;

a body region composed of epitaxial Si formed on the gate dielectric film;

a diffusion layer for source/drain regions formed on both sides of the body region; and a body terminal connected to the body region for applying a specified potential to the body region.

The above semiconductor device has a structure in which the body region is disposed over the gate electrode, whose upper and lower positions are mutually reversed compared to a conventional semiconductor device. For this reason, a body terminal can be readily connected to any portion of the body region. As a result, when a transistor has a short gate length and a long gate width, plural contact sections may be disposed on the body region to the extent that the substrate floating effect does not occur, such that the substrate floating effect is sufficiently suppressed.

A semiconductor device in accordance with the present invention is characterized in comprising:

a single crystal Si layer formed on a dielectric film;

a first opening section formed in the single crystal Si layer;

an interlayer dielectric film formed in the first opening section;

a second opening section formed in the interlayer dielectric film;

a gate electrode formed in the second opening section;

a gate dielectric film formed on the gate electrode;

an epitaxial Si layer formed on the gate dielectric layer;

a body region formed in the epitaxial Si layer;

a diffusion layer for source/drain regions formed in the epitaxial Si layer and located on both sides of the body region; and a body terminal connected to the body region for applying a specified potential to the body region.

Also, the semiconductor device in accordance with the present invention may preferably further include a supporting substrate formed below the dielectric film.

Further, the semiconductor device in accordance with the present invention may further include a third opening section located around a source/drain forming region formed in the epitaxial Si layer, and a dielectric layer embedded in the third opening section.

A method for manufacturing a semiconductor device in accordance with the present invention is characterized in comprising the steps of:

forming a gate electrode on a dielectric film;

forming a gate dielectric film on the gate electrode;

forming an epitaxial Si layer on the gate dielectric film;

forming a body region in the epitaxial Si layer;

forming a diffusion layer for source/drain regions on both sides of the body region in the epitaxial Si layer; and forming a body terminal on the body region for applying a specified potential to the body region.

The above method for manufacturing a semiconductor device provides a structure in which the body region is disposed over the gate electrode through the gate dielectric film, whose upper-lower positions are mutually reversed compared to those of conventional semiconductor devices. For this reason, after the step of forming the diffusion layer for source/drain regions, the upper surface of the body region is entirely exposed, which makes it easy to connect a body terminal to any portion of the body region. As a result, when a transistor has a short gate length and a long gate width, plural contact sections may be disposed over the body region to the extent that the substrate floating effect does not occur, and thus the substrate floating effect is sufficiently suppressed.

A method for manufacturing a semiconductor device in accordance with the present invention is characterized in comprising the steps of:

preparing a SOI substrate composed of a supporting substrate, a dielectric film and a single crystal Si layer;

forming a first opening section in the single crystal Si layer at a position around a gate electrode forming region;

embedding an interlayer dielectric film in the first opening section;

forming a second opening section in the single crystal Si layer at a position around a gate electrode forming region;

forming a gate electrode in the second opening section;

forming a gate dielectric film on the gate electrode;

forming an epitaxial Si layer on the gate dielectric film;

forming a body region in the epitaxial Si layer;

forming a diffusion layer for source/drain regions in the epitaxial Si layer located on both sides of the body region; and forming a body terminal on the body region for applying a specified potential to the body region.

Also, in the method for manufacturing a semiconductor device in accordance with the present invention, the step of embedding the interlayer dielectric film may preferably comprise the steps of depositing an interlayer dielectric film in the first opening section and on the single crystal Si layer and removing the interlayer dielectric film existing over the single crystal Si layer, to thereby embed the interlayer dielectric film in the first opening section.

Also, in the method for manufacturing a semiconductor device in accordance with the present invention, the step of forming the gate electrode may preferably comprise the steps of depositing a metal film, a polycrystal silicon film or a metal silicide film in the second opening section and on the single crystal Si layer, and removing the metal film, the polycrystal silicon film or the metal silicide film existing over the single crystal Si layer to thereby form the gate electrode in the second opening section.

Also, in the method for manufacturing a semiconductor device in accordance with the present invention, the step of forming the body region may preferably be the step of introducing impurity ion in the epitaxial Si layer.

Also, the method for manufacturing a semiconductor device in accordance with the present invention may further comprise the steps of forming a third opening section in the epitaxial Si layer at a location around a source/drain forming region between the step of forming the epitaxial Si layer and the step of forming the body region.

BRIEF DESCRIPTION OF THE DRAWINGS

FIG. 11(a) shows a plan view of an example of a conventional semiconductor device, and FIG. 11(b) shows a cross section taken along lines 11b—11b indicated in FIG. 11(a).

DESCRIPTION OF THE PREFERRED EMBODIMENTS

Embodiments of the present invention will be described below with reference to the accompanying drawings.

Figure 1:
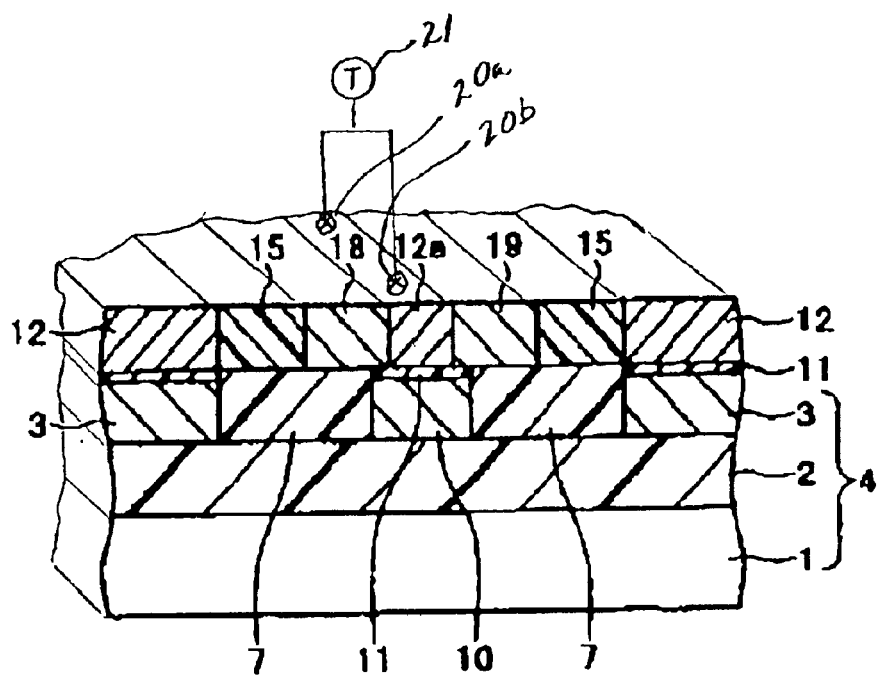
FIG. 1 shows a cross-sectional view of a semiconductor device in accordance with an embodiment of the present invention.

FIG. 1 shows a cross-sectional view of a semiconductor device in accordance with an embodiment of the present invention.

The semiconductor device is formed on a SOI substrate 4. The SOI substrate 4 is formed from a supporting substrate 1, an embedded oxide film 2 and a single crystal Si layer 3. An opening section is provided in the single crystal Si layer 3, and a gate electrode 10 composed of metal such as tungsten (W) and interlayer dielectric films 7 are formed in the opening section. The interlayer dielectric films 7 are located around the gate electrode 10.

A gate oxide film 11 is formed on the gate electrode 10. An epitaxial Si layer 12 is formed on the gate oxide film 11. Opening sections are formed in the epitaxial Si layer 12, and interlayer dielectric films 15 are embedded in the opening sections.

A body region 12a located above the gate electrode 10, and diffusion layers 18 and 19 for the source/drain regions located on both sides of the body region 12a are formed in the epitaxial Si layer 12. Interlayer dielectric films 15 are located around the diffusion layers 18 and 19 for source/drain regions. Diffusion layers of LDD (Lightly Doped Drain) regions (not shown) are formed between the diffusion layers 18 and 19 for source/drain regions and the body region 12a.

One or more contacts or contact sections that connect a body terminal 21 for fixing the body potential is formed on the body region 12a. In the case of a transistor with a short gate length and long gate width, a plurality of contact sections 20a,20b may be disposed on the body region 12a to prevent the substrate floating effect from occurring. By applying a specified voltage to the body region 12a through the body terminal 21, the body potential is fixed to thereby minimize the substrate floating effect.

Next, a method for manufacturing the semiconductor device will be described. FIGS. 2–9 show in cross section the method for manufacturing the semiconductor device shown in FIG. 1.

Figure 2:
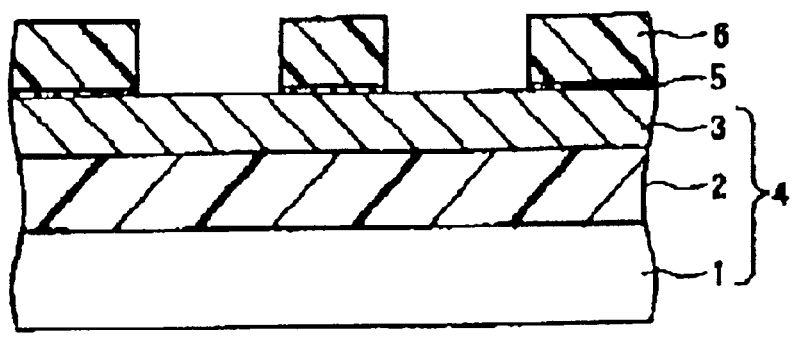
FIG. 2 shows in cross section a method for manufacturing a semiconductor device in accordance with an embodiment of the present invention.

First, as shown in FIG. 2, a SOI substrate 4 is prepared. The SOI substrate 4 is formed from a supporting substrate 1 composed of single crystal silicon, an embedded oxide film (BOX layer) 2 formed on the supporting substrate 1, and a single crystal Si layer 3 that is formed on the embedded oxide film 2. The SOI substrate 4 can be manufactured by any of a variety of manufacturing methods, and for example, can be manufactured by a bonding method, a SIMOX method.

Then, a TiN film 5 as a stopper film is deposited by a sputtering method on the single crystal Si layer 3, and a silicon nitride film ($Si_3N_4$ film) 6 is deposited on the TiN film 5 by a CVD (Chemical Vapor Deposition) method. Next, the silicon nitride film 6 and the TiN film 5 are patterned to form opening sections in the silicon nitride film 6 and the TiN film 5 over regions where interlayer dielectric films composed of silicon oxide films or the like are to be embedded.

Figure 3:
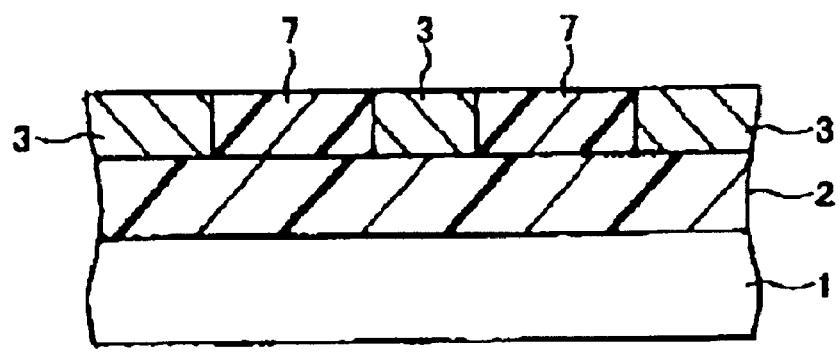
FIG. 3 shows the method for manufacturing a semiconductor device in accordance with the embodiment of the present invention, and shows in cross section a step after the one shown in FIG. 2.

Then, the single crystal Si layer 3 is etched using the silicon nitride film 6 and the TiN film 5 as a mask, whereby opening sections (grooves) are formed in the single crystal Si layer 3. Then, an interlayer dielectric film is deposited in the opening sections and on the silicon nitride film 6 by a CVD method. Then, the interlayer dielectric film and the silicon nitride film 6 are removed by a CMP (Chemical Mechanical Polishing) method, using the TiN film 5 as a stopper. By these steps, interlayer dielectric films 7 are embedded in the grooves in the single crystal Si layer 3, as shown in FIG. 3. Here, a CMP method is used to remove the interlayer dielectric film. However, the interlayer dielectric film can be removed by an etch-back method.

Figure 4:
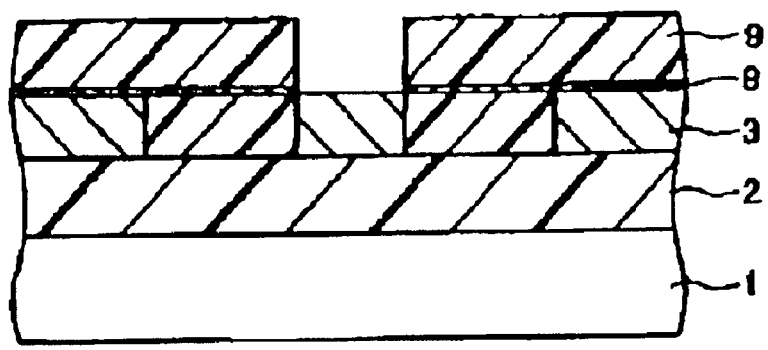
FIG. 4 shows the method for manufacturing a semiconductor device in accordance with the embodiment of the present invention, and shows in cross section a step after the one shown in FIG. 3.

Next, as shown in FIG. 4, a TiN film 8 as a stopper film is deposited on the single crystal Si layer 3 and the interlayer dielectric film 7 by a sputtering method, and a silicon nitride film ($Si_3N_4$ film) 9 is deposited on the TiN film 8 by a CVD method. Next, the silicon nitride film 9 and the TiN film 8 are patterned to form an opening section in the silicon nitride film 9 and the TiN film 8 over a region where a gate electrode is to be formed.

Figure 5:
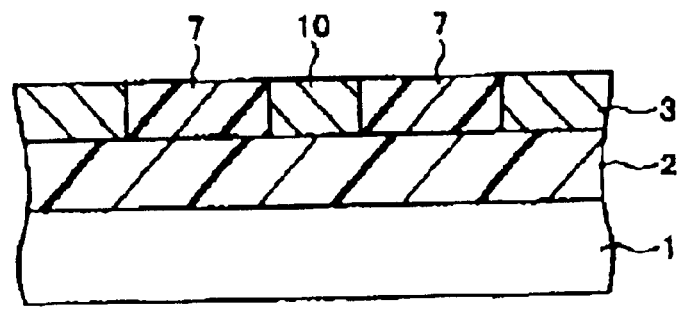
FIG. 5 shows the method for manufacturing a semiconductor device in accordance with the embodiment of the present invention, and shows in cross section a step after the one shown in FIG. 4.

Then, the single crystal Si layer 3 is etched, using the silicon nitride film 9 and the TiN film 8 as a mask, whereby an opening section (groove) is formed in the single crystal Si layer 3. The opening section is formed inside the interlayer dielectric films 7. Then, a metal film such as a W film is deposited in the opening section and on the silicon nitride film 9 by a sputtering method. Then, the W film and the silicon nitride film 9 are removed by a CMP (Chemical Mechanical Polishing) method, using the TiN film 8 as a stopper. Next, the TiN film 8 is removed. By these steps, a gate electrode 10 composed of the W film is embedded in the interlayer dielectric film 7, as shown in FIG. 5.

Figure 6:
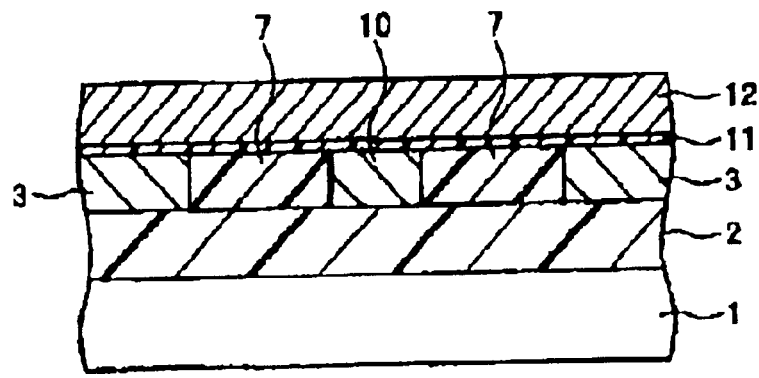
FIG. 6 shows the method for manufacturing a semiconductor device in accordance with the embodiment of the present invention, and shows in cross section a step after the one shown in FIG. 5.

Next, as shown in FIG. 6, a gate oxide film 11 is formed on the gate electrode 10 by a CVD method. Then, a Si layer 12 is formed on the gate oxide film 11 by a molecular beam epitaxial growth method.

Figure 7:
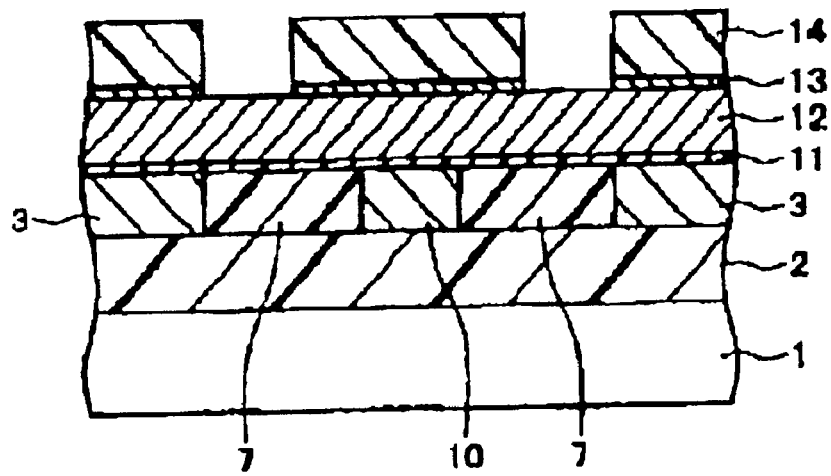
FIG. 7 shows the method for manufacturing a semiconductor device in accordance with the embodiment of the present invention, and shows in cross section a step after the one shown in FIG. 6.

Then, as shown in FIG. 7, a TiN film 13 as a stopper film is deposited on the Si layer 12 by a sputtering method, and a silicon nitride film ($Si_3N_4$ film) 9 is deposited on the TiN film 13 by a CVD method. Next, the silicon nitride film 14 and the TiN film 13 are patterned to form opening sections in the silicon nitride film 14 and the TiN film 13.

Figure 8:
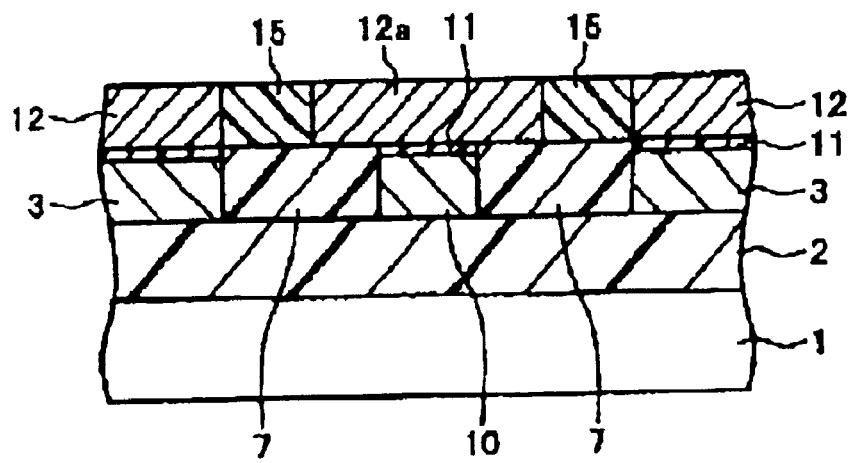
FIG. 8 shows the method for manufacturing a semiconductor device in accordance with the embodiment of the present invention, and shows in cross section a step after the one shown in FIG. 7.

Then, the Si layer 12 is etched using the silicon nitride film 14 and the TiN film 13 as a mask, whereby grooves are formed in the Si layer 12. Next, interlayer dielectric films are deposited in the grooves and on the silicon nitride film 14 by a CVD method. Then, the interlayer dielectric film and the silicon nitride film 13 are removed by a CMP method using the TiN film 13 as a polishing stopper. Next, the TiN film 13 is removed. As a result, as shown in FIG. 8, interlayer dielectric films 15 are embedded around the Si layer 12a that becomes a body region.

Figure 9:
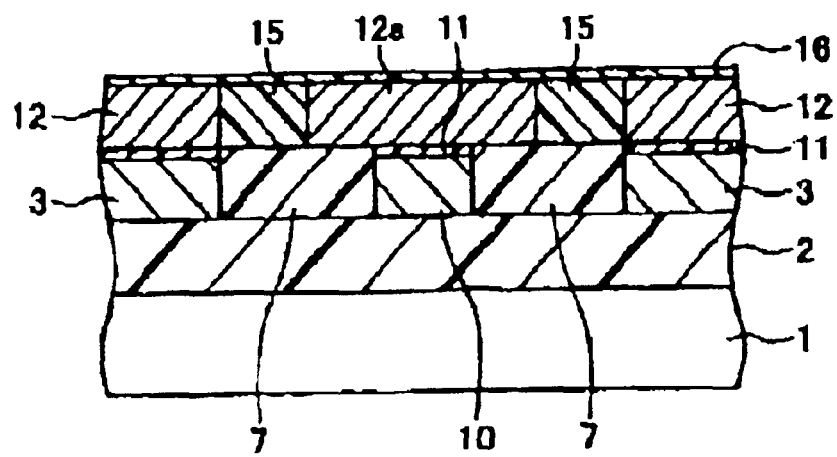
FIG. 9 shows the method for manufacturing a semiconductor device in accordance with the embodiment of the present invention, and shows in cross section a step after the one shown in FIG. 8.

Then, as shown in FIG. 9, a thin silicon oxide film 16 as a protection film is formed on the Si layers 12a and 12 and the interlayer dielectric film 15 by a thermal oxidation method or a CVD method. The thin silicon oxide film 16 is to protect the body region from an ion implanting step to be conducted next. Then, impurity ions are ion-implanted in the Si layers 12a and 12.

Figure 10:
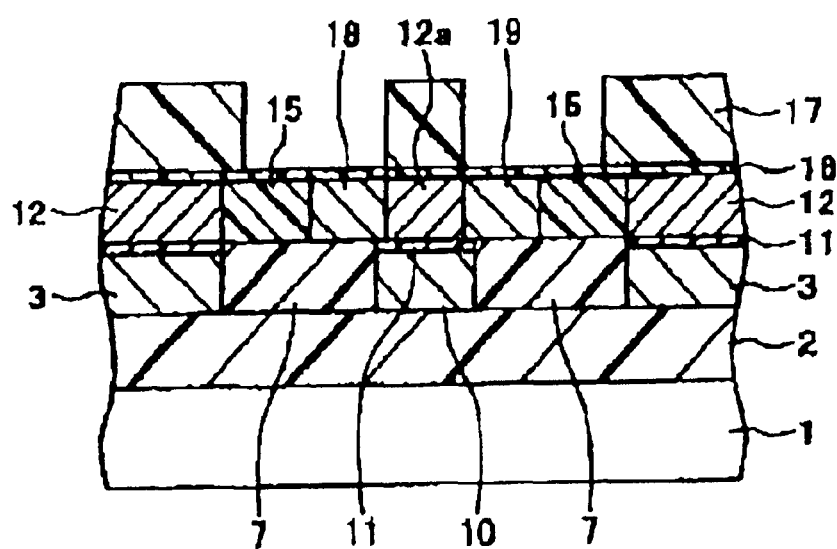
FIG. 10 shows the method for manufacturing a semiconductor device in accordance with the embodiment of the present invention, and shows in cross section a step after the one shown in FIG. 9.

Next, impurity ions are ion-implanted in LDD regions in the epitaxial Si layer 12. Next, as shown in FIG. 10, a photoresist film is coated on the silicon oxide film 16, and the photoresist film is exposed and developed, whereby a resist pattern 17 with openings defined over the source/drain regions is formed on the silicon oxide film 16. Next, impurity ions are ion-implanted in the Si layer 12a using the resist pattern as a mask, and a heat treatment is conducted. As a result, diffusion layers 18 and 19 for source/drain regions are formed in the Si layer 12a, and diffusion layers of LDD regions (not shown) are formed. Then, the resist pattern 17 is removed, and the semiconductor device shown in FIG. 1 is completed.

The embodiment described above provides a structure in which the body region 12a is disposed over the gate electrode 10, whose upper-lower positions are mutually reversed compared to those of conventional semiconductor devices. For this reason, the upper surface of the body region 12a is entirely exposed, and therefore a body terminal 21 can be readily connected to any portion of the body region. Accordingly, when a transistor has a short gate length and a long gate width, plural contact sections may be disposed on the body region to the extent that the substrate floating effect does not occur, whereby the substrate floating effect is sufficiently suppressed.

Also, in the embodiment described above, the body region does not have to be extended out from one end of the gate electrode in order to form a contact section therein for fixing the body potential like a conventional semiconductor device. Therefore, an increase in the area occupied by the element can be avoided, and device miniaturization can be promoted.

It is noted that the present invention is not limited to the embodiments described above, and many modifications can be made and implemented. For example, in the above embodiment, the gate electrode 10 composed of a W film is used. However, a gate electrode composed of metal silicide such as W silicide, Ti silicide, or Co silicide can also be used. Also, a gate electrode composed of a polycrystal silicon film can be used. In this case, a step of ion-implanting impurity ions in the gate electrode is needed to increase the conductivity of the gate electrode, and also, a gate oxide film may be formed by a thermal oxidation method.

As described above, in accordance with the present invention, a body region is disposed over a gate electrode. Accordingly, the present invention provides a semiconductor device that can restrict the substrate floating effect even in a transistor having a short gate length and long gate width, and a method for manufacturing the same.

The entire disclosure of Japanese Patent Application Serial No. 2001-233538 filed Aug. 1, 2001 is expressly incorporated by reference herein.

What is claimed is:

1. A method of manufacturing a semiconductor device, the method comprising the steps of:

preparing a substrate composed of a supporting substrate, a dielectric film and a single crystal silicon (Si) layer;

forming a first opening section in the single crystal Si layer at a position around a gate electrode forming region;

embedding an interlayer dielectric film in the first opening section;

forming a second opening section in the single crystal Si layer at a position around a gate electrode forming region;

forming a gate electrode in the second opening section;

forming a gate dielectric film on the gate electrode;

forming an epitaxial silicon (Si) layer on the gate dielectric film;

forming a body region in the epitaxial Si layer;

forming a diffusion layer for source/drain regions in the epitaxial Si layer located on both sides of the body region; and forming a body terminal on the body region for applying a specified potential to the body region.

2. A method for manufacturing a semiconductor device according to claim 1, wherein the step of embedding the interlayer dielectric film includes the steps of depositing an interlayer dielectric film In the first opening section and on the single crystal Si layer and removing the interlayer dielectric film existing over the single crystal Si layer, to thereby embed the interlayer dielectric film in the first opening section.

3. A method for manufacturing a semiconductor device according to claim 1, wherein the step of forming the gate electrode includes the steps of depositing a metal film, a polycrystal silicon film or a metal suicide film in the second opening section and on the single crystal Si layer, and removing the metal film, the polycrystal silicon film or the metal silicide film existing over the single crystal Si layer to thereby form the gate electrode in the second opening section.

4. A method for manufacturing a semiconductor device according to claim 3, wherein the step of forming the body region is includes introducing impurity ions in the epitaxial Si layer.

5. A method for manufacturing a semiconductor device according to claim 4, further comprising the steps of forming a third opening section in the epitaxial Si layer at a location around a source/drain forming region between the step of forming the epitaxial Si layer and the step of forming the body region.

* * * * *